United States Patent [19]

Kusunoki et al.

[11] Patent Number: 4,584,447
[45] Date of Patent: Apr. 22, 1986

[54] ELECTROMAGNETIC WAVE ENERGY SEAL ARRANGEMENT

[75] Inventors: Shigeru Kusunoki; Tomotaka Nobue; Takashi Kashimoto, all of Yamatokoriyama, Japan

[73] Assignee: Matsushita Electric Industrial Co., Ltd., Kadoma, Japan

[21] Appl. No.: 599,434

[22] PCT Filed: Aug. 18, 1983

[86] PCT No.: PCT/JP83/00269
§ 371 Date: Mar. 26, 1984
§ 102(e) Date: Mar. 26, 1984

[87] PCT Pub. No.: WO84/01083
PCT Pub. Date: Mar. 15, 1984

[30] Foreign Application Priority Data

Aug. 25, 1982 [JP] Japan ................................ 57-148002
Aug. 25, 1982 [JP] Japan ................................ 57-148003
Aug. 25, 1982 [JP] Japan ................................ 57-148004
Aug. 25, 1982 [JP] Japan ................................ 57-148005

[51] Int. Cl.[4] .............................................. H05R 6/76
[52] U.S. Cl. ...................... 219/10.55 D; 219/10.55 R; 174/35 GC
[58] Field of Search ................. 219/10.55 D, 10.55 R; 174/35 GC, 35 MS

[56] References Cited

U.S. PATENT DOCUMENTS 3,767,884 10/1973 Osepchuk et al. ............ 219/10.55 D
4,254,318 3/1981 Ohkawa et al. .............. 219/10.55 D
4,449,025 5/1984 Ikeda et al. .................. 219/10.55 D
4,471,194 9/1984 Hosokawa et al. ........... 219/10.55 D
4,475,023 10/1984 Iwabuchi et al. ............ 219/10.55 D

FOREIGN PATENT DOCUMENTS 53-48504 4/1978 Japan .
56-17668 2/1981 Japan .

Primary Examiner—Philip H. Leung
Attorney, Agent, or Firm—Wenderoth, Lind & Ponack

[57] ABSTRACT

In an apparatus which produces high frequency electromagnetic waves, a choke portion is provided in a leakage transmission path, which choke portion has a groove wall corresponding to a grounded conductor, a number of strip conductors arranged with a line width a and a pitch p, and a groove bottom, so as to minimize leakage propagation in the longitudinal direction of the groove. Further, this choke portion is designed so that the characteristic impedance of its portion is changed in a region shorter than λ/4 of the frequency to be used. As a result, the depth and width of the groove can also be made less than λ/4.

9 Claims, 49 Drawing Figures

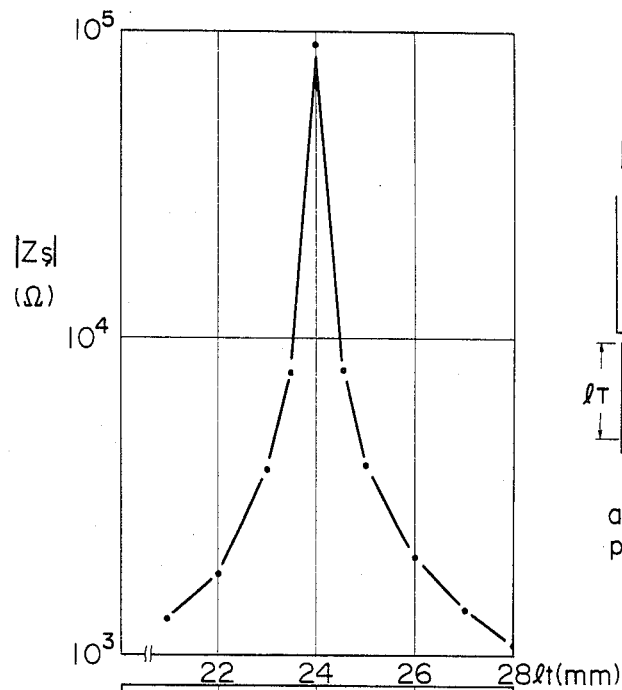
FIG. 9(a).
FIG. 9(b).
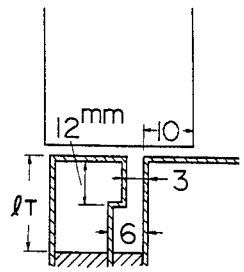
FIG. 9(c).
a = 10
p = 15

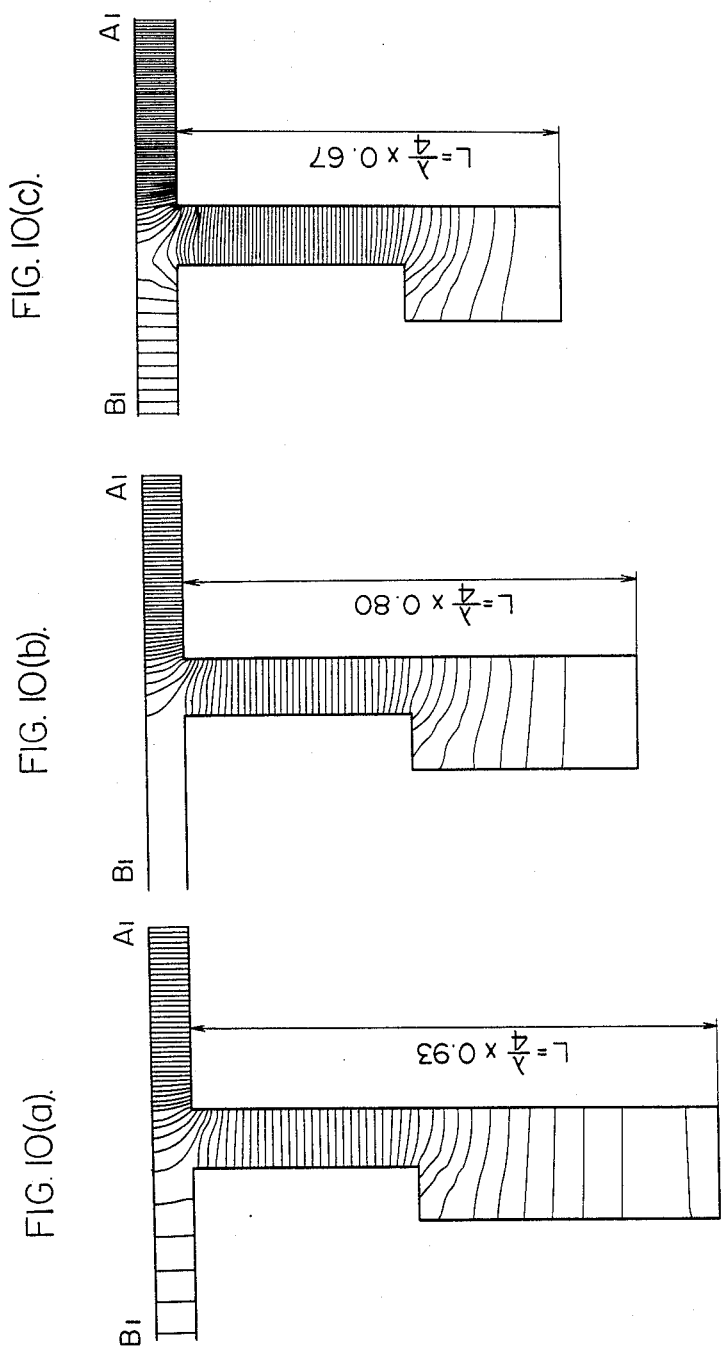

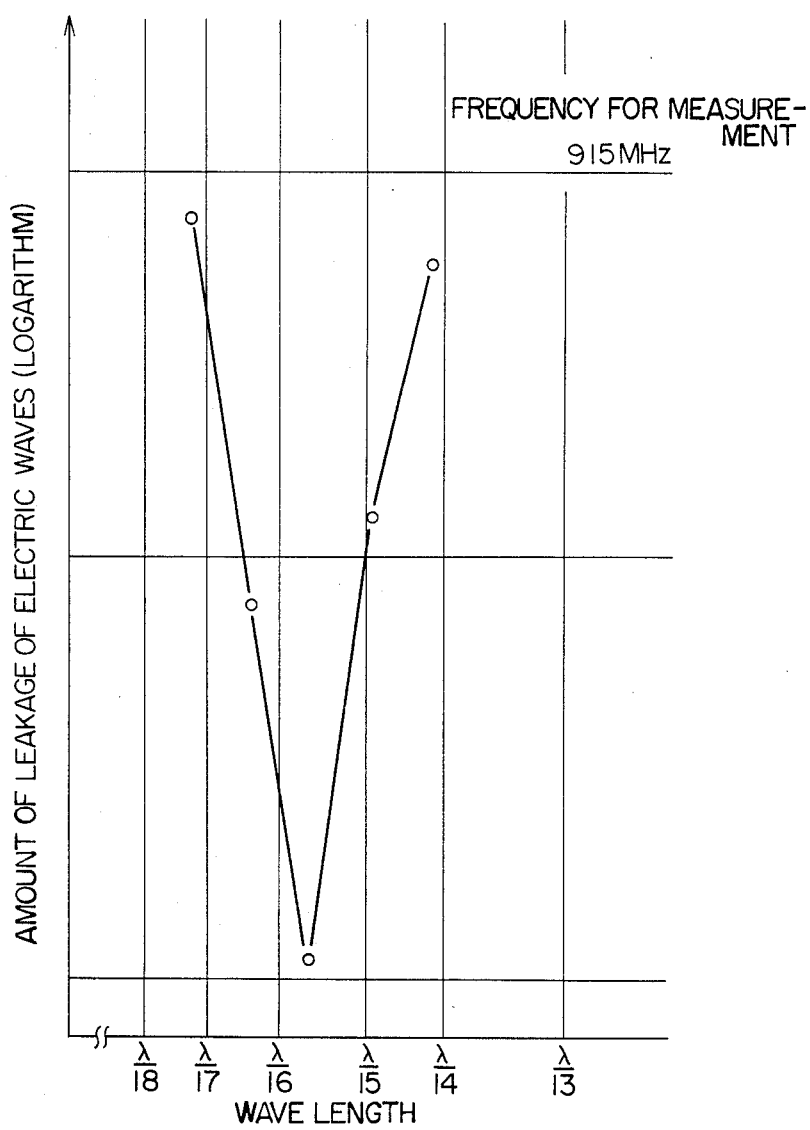

ELECTROMAGNETIC WAVE ENERGY SEAL ARRANGEMENT

TECHNICAL FIELD

This invention relates to an apparatus which produces high frequency electromagnetic waves and more particularly it relates to prevention of leakage of said high frequency electromagnetic waves from said apparatus.

BACKGROUND ART

Means for prevention of leakage of high frequency electromagnetic waves will be described herein by taking, as an example, a microwave oven, which cooks food by dielectrically heating it by high frequency electromagnetic waves.

A microwave oven comprises a heating chamber for receiving food for heating it by high frequency waves, and a door adapted to open and close the opening provided in said heating chamber for putting in and taking out food to be cooked, wherein an electric wave sealing measure is taken to prevent high frequency electromagnetic waves in the heating chamber from leaking outside the chamber to hurt the human body when the door is opened to put in and take out food.

As another example, in waveguides utilized in communications systems, an electromagnetic sealing device is provided in the mechanical junction between the waveguides.

As an example of prior art, U.S. Pat. No. 3,182,164 is shown in FIG. 1. In FIG. 1, the numeral 1 denotes a heating chamber for a microwave oven, and a door 4 having a knob 3 is provided for covering the opening 2 in said heating chamber 1 so that the opening can be opened and closed. The peripheral edge of the door 4 is formed with a hollow choke portion having a clearance 5 which opens toward the heating chamber 1. The depth 7 of the choke portion is designed to be substantially ¼ of the wavelength of the high frequency wave to be used. In this case, the thickness of the door 4 is also ¼ of the wavelength. That is, since the frequency of the electromagnetic wave heretofore used in microwave ovens is 2450 MHz, ¼ of the wavelength is about 30 mm. In order to be opposed to the choke portion 6 of this length, the peripheral edge 8 formed around the opening 2 in the heating chamber 1 has a thickness 9 which is greater than ¼ of the wavelength. Therefore, the effective size of the opening 2 in the heating chamber 1 is smaller by an amount corresponding to the size of the peripheral edge 8.

As another example of prior art, U.S. Pat. No. 2,500,676 is shown in FIGS. 2(a) and (b). This example also shows a construction for microwave ovens, wherein high frequency waves resulting from the oscillation of a magnetron 10 are fed to a heating chamber 11 to cook food 12. The opening 13 in this heating chamber 11 is provided with a door 14 covering the opening 13 so that the latter can be opened and closed. The peripheral portion of this door 14 is formed with a choke portion 15 in the form of a groove to prevent leakage of high frequency waves. The depth of this choke portion 15 is also designed to be ¼ of the wavelength of the high frequency wave to be used. As a result, the effective size of the opening 13 is correspondingly smaller than that of the heating chamber 11.

As described above, the conventional choke portions are based on the technical concept that ¼ of the wavelength is essential for attenuating the high frequency waves.

Thus, let $Z_0$ be the characteristic impedance of the choke portion, and L be its depth. Then, when the terminal end portion is shorted, the impedance $Z_{IN}$ at the choke opening is given by $$Z_{IN} = jZ_0 \tan\left(\frac{2\pi L}{\lambda_0}\right)$$

(where $\lambda_0$ is the free space wavelength.)

The electric wave attenuating means of the choke type is based on the principle of selecting the depth L of the choke so that it is ¼ of the wavelength, thereby achieving.

$$|Z_{IN}| = Z_0 \tan\left(\frac{\pi}{2}\right) = \infty$$

If the choke is filled with a dielectric (the specific dielectric constant of the material: $\epsilon_r$), the wavelength $\lambda'$ of the electric waves is reduced to $$\lambda' \approx \lambda_0/\sqrt{\epsilon_r}.$$

In this case the depth $L'$ of the choke portion is reduced as shown below.

$$L' \approx L/\sqrt{\epsilon_r}$$

However, the relation $L'=\lambda'/4$ is still retained, so that in the choke system it is impossible to make the depth substantially less than ¼ of the wavelength, imposing limitations on the reduction of the size of the choke portion.

The choke system is based on the known ¼ wavelength impedance conversion principle. As shown in FIG. 3, let $Z_{OC}$ be the characteristic impedance, $l_C$ be the depth of the groove, $Z_{OP}$ be the characteristic impedance of a leakage path 17 extending from the heating chamber to the choke groove, $l_p$ be the length of said leakage path 17, and $\lambda$ be the wavelength to be used. Then, as shown in FIG. 3, the shorted impedance ($Z_C=0$) of the bottom C of a choke groove 18 is $$Z_B = jZ_{OC} \tan \frac{2\pi}{\lambda} l_C$$

at the opening B in the choke groove 18. The numeral 19 denotes the heating chamber of the microwave oven, and 20 denotes a door. By selecting $$l_C = \frac{\lambda}{4},$$

the conversion $|Z_B|=\infty$ is possible. The impedance $Z_A$ when the impedance $Z_B$ of the opening B is looked at from the line starting point A is $$Z_A = -jZ_{OP} \frac{1}{\tan \frac{2\pi}{\lambda} l_P}.$$

By selecting $$l_p = \frac{\lambda}{4},$$

the conversion $|Z_A|=0$ is possible. Thus, the ingenious utilization of the ¼ wavelength impedance inversion principle enables the shorted state at the bottom of the choke groove 18 to appear at the line starting point, whereby the electromagnetic wave energy seal arrangement can be put to practical use.

By filling the leakage path 17 and choke groove 17 with a dielectric having a specific dielectric constant $\epsilon_r$, the wavelength $\lambda'$ is made $\lambda\sqrt{\epsilon_r}$, but the same effect can be obtained by using the ¼ wavelength ($\lambda'/4$) impedance principle.

In addition, as another example of prior art, there is U.S. Pat. No. 3,584,177.

Further, there is an example of prior art such as U.S. Pat. No. 3,511,959 wherein impedance inversion is effected by changing the characteristic impedance of the leakage path at every unit length of $\lambda/4$.

As for a method of impedance inversion of transmission path length using $\lambda/4$ as a unit wherein the leakage transmission path is made a parallel transmission system having a narrower width than the aforesaid transmission path and the leakage propagation mode is a TEM wave, there are U.S. Pat. Nos. 2,772,402 and 2,850,706 and U.K. Pat. No. 1,022,103.

In the case of the references cited above, it is necessary that the length of the transmission path be at least $\lambda/4$.

The electromagnetic wave energy seal arrangements based on the length $\lambda/4$ have superior performance and are capable of maintaining the design performance for long periods of time, so that they have often been employed in microwave communications systems and high frequency heating apparatuses. However, as is clear from the prior art item described above, there has been a disadvantage the length cannot be made less than $\lambda/4$.

DISCLOSURE OF THE INVENTION

This invention provides an electromagnetic wave energy seal arrangement whose construction changes the technical concept based on $\lambda/4$ of the frequency to be used and whose length is less than $\lambda/4$.

More particularly, a Lecher wire system is used for the leakage transmission path to reduce electric wave propagation in the longitudinal direction of the groove, said Lecher wire system comprising a microstrip line wherein strip conductors are opposed to a grounded conductor.

The characteristic impedance of the microstrip line is changed in a region shorter than $\lambda/4$, whereby the size is reduced. The main point of the arrangement lies in a line configuration utilizing the relation that the characteristic impedance $Z_0$ of the microstrip line is approximately proportional to $b/a\sqrt{\epsilon_r}$ where a is the line width, b is the line clearance, and $\epsilon_r$ is the specific dielectric constant of the material.

BRIEF DESCRIPTION OF DRAWINGS

FIGS. 7, 8, and 9a and 9b are characteristic diagrams of said device;

FIG. 9c is a sectional view of said device;

FIGS. 10a, b, and c shows lines of electric force in said device;

FIG. 18 is a characteristic diagram of said device;

BEST MODE OF CARRYING OUT THE INVENTION

The present invention relates to a device for sealing electric waves in high frequency equipment including volume type video disc players and waveguide systems but will be described, centered on a microwave oven such as one shown in FIG. 4.

Figure 1:
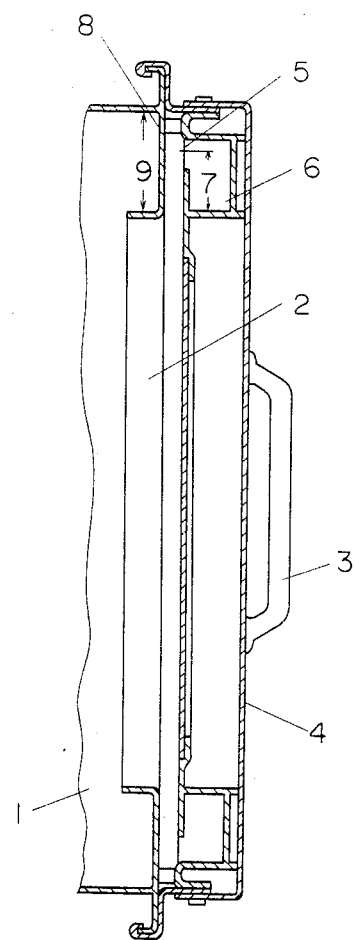
FIG. 1 is a sectional view of a conventional electromagnetic wave energy seal arrangement.
Figure 2A:
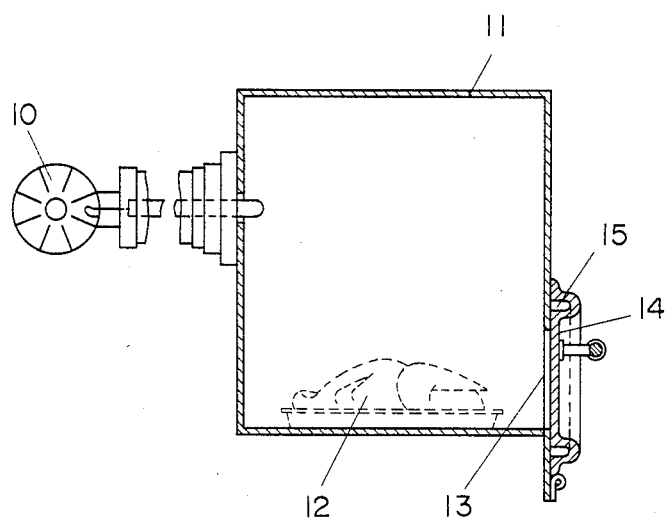
FIGS. 2a and b are sectional views of a conventional electromagnetic wave energy seal arrangement.
Figure 2B:
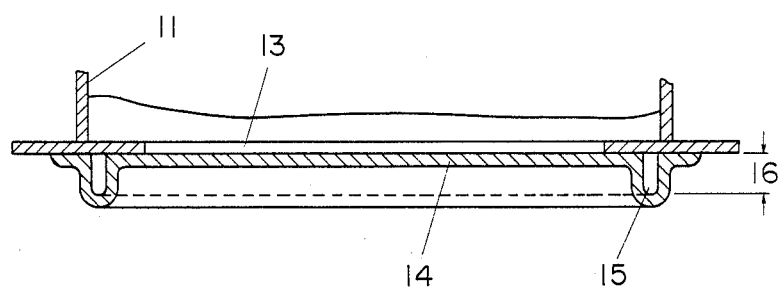
Figure 3:
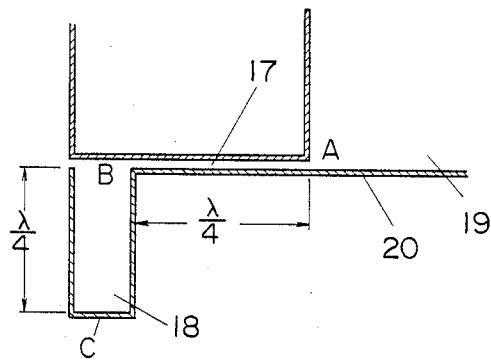
FIG. 3 is a sectional view of a conventional electromagnetic wave energy seal arrangement.
Figure 4:
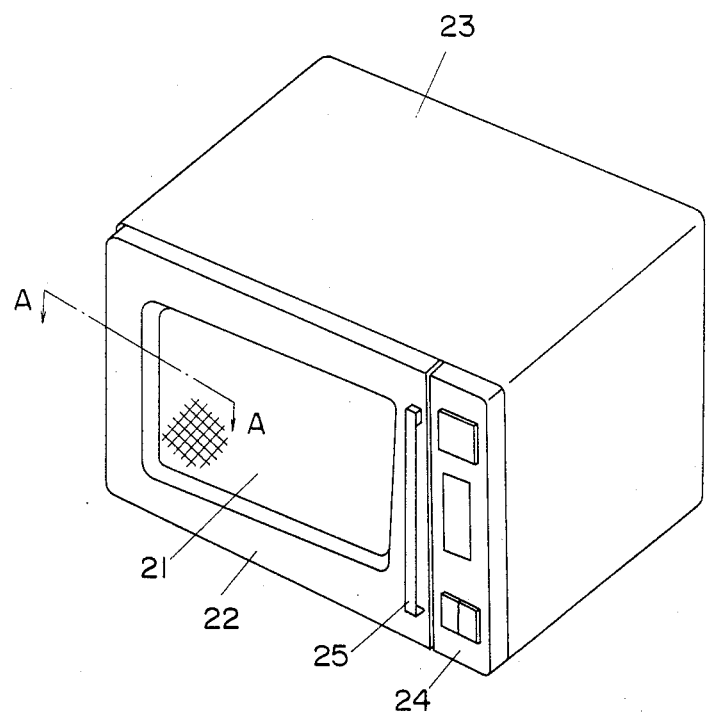
FIG. 4 is a perspective view of a microwave oven using an electromagnetic wave energy seal arrangement according to an embodiment of the present invention.

FIG. 4 is a perspective view of a microwave oven wherein a door 22 having a punched plate 21 is mounted on the main body covered with a main body cover 23. The main body is provided with an operating panel 24, and a door knob 25 is mounted on said door 22.

The electric wave sealing device is interposed between the heating chamber and external space of the main body, with the door mounted on either around them.

Figure 5:
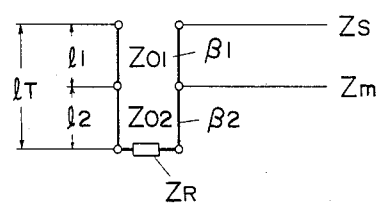
FIG. 5 is an equivalent circuit diagram for explaining the basic principle of the invention.

The new, impedance conversion principle of the present invention will now be described with reference to FIG. 5.

Transmission lines whose characteristic impedances are $Z_{01}$ and $Z_{02}$ and whose propagation constants are $\beta_1$ and $\beta_2$ have lengths, $l_1$ and $l_2$, respectively, the total length being $l_T$, and an impedance $Z_R$ is loaded at the receiving end. The impedances looked at from the discontinuous boundary and the transmission starting end are denoted by $Z_m$ and $Z_S$, respectively.

(I) When the receiving end impedance $Z_R$ is zero ($Z_R=0$), the respective impedances are $$Z_m = jZ_{02}\tan\beta_2 l_2 \text{ and } Z_S = jZ_{01}\frac{\tan\beta_1 l_1 + K\tan\beta_2 l_2}{1 - K\tan\beta_1 l_1 \tan\beta_2 l_2}$$

where, $$K = \frac{Z_{02}}{Z_{01}}.$$

The formula for the starting end impedance $Z_S$ indicates that if the relation $1 = K \tan \beta_1 l_1 \tan \beta_2 l_2$ is satisfied, the zero impedance of the starting end can be converted to infinity.

As compared with the conventional choke system (corresponding to $K=1$), by increasing the impedance ratio K it is possible to correspondingly reduce the product of $\tan \beta_1 l_1$ and $\tan \beta_2 l_2$. When it is considered that $\tan \beta_1 l_1$ and the dimension $l_1$ and $\tan \beta_2 l_2$ and the dimension $l_2$ are in positive correlation where the dimensions $l_1$ and $l_2$ are less than ¼ of the wavelength, it is seen that the dimensions $l_1$ and $l_2$ can be reduced by an amount corresponding to the increase in the impedance ratio ($K=Z_{02}/Z_{01}$), as compared with the choke system, and that the dimension $l_T$ can be reduced to less than ¼ of the wavelength.

(II) When the receiving end impedance is infinity ($Z_R=\infty$), the respective impedances are as follows.

$$Z_m = -jZ_{02}\frac{1}{\tan\beta_2 l_2},$$

$$Z_S = jZ_{01}\frac{\tan\beta_1 l_1 \tan\beta_2 l_2 - K}{\tan\beta_2 l_2 + K\tan\beta_1 l_1}$$

(where $$K = \frac{Z_{02}}{Z_{01}}).$$

The formula for the starting end impedance $Z_S$ indicates that the infinite impedance of the receiving end can be converted to zero by making $K = \tan \beta_1 l_1 \tan \beta_2 l_2$. By reducing the impedance ratio as compared with the conventional choke system ($K=1$), the dimensions $l_1$ and $l_2$ can be correspondingly reduced and hence the dimension $l_T = l_1 + l_2$ can be made less than ¼ of the wavelength.

Next, the relation between the characteristic impedance and the line construction will be described.

Figure 6:
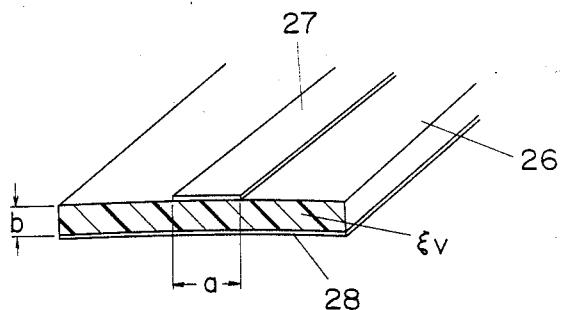
FIG. 6 is a sectional perspective view of a microstrip line.

FIG. 6 shows a microstrip line 26. The electric waves propagate in a quasi TEM mode, but if this situation is simplified to assume that they propagate a true TEM mode, the characteristic impedance $Z_0$ of the line is $$Z_0 = \frac{Kb}{a\sqrt{\epsilon_r}}.$$

The numeral 28 denotes a grounded conductor. (a: line width of strip conductor 27, b: line clearance, $\epsilon_r$: the specific dielectric constant of the material, K: proportionality constant)

Figure 7:
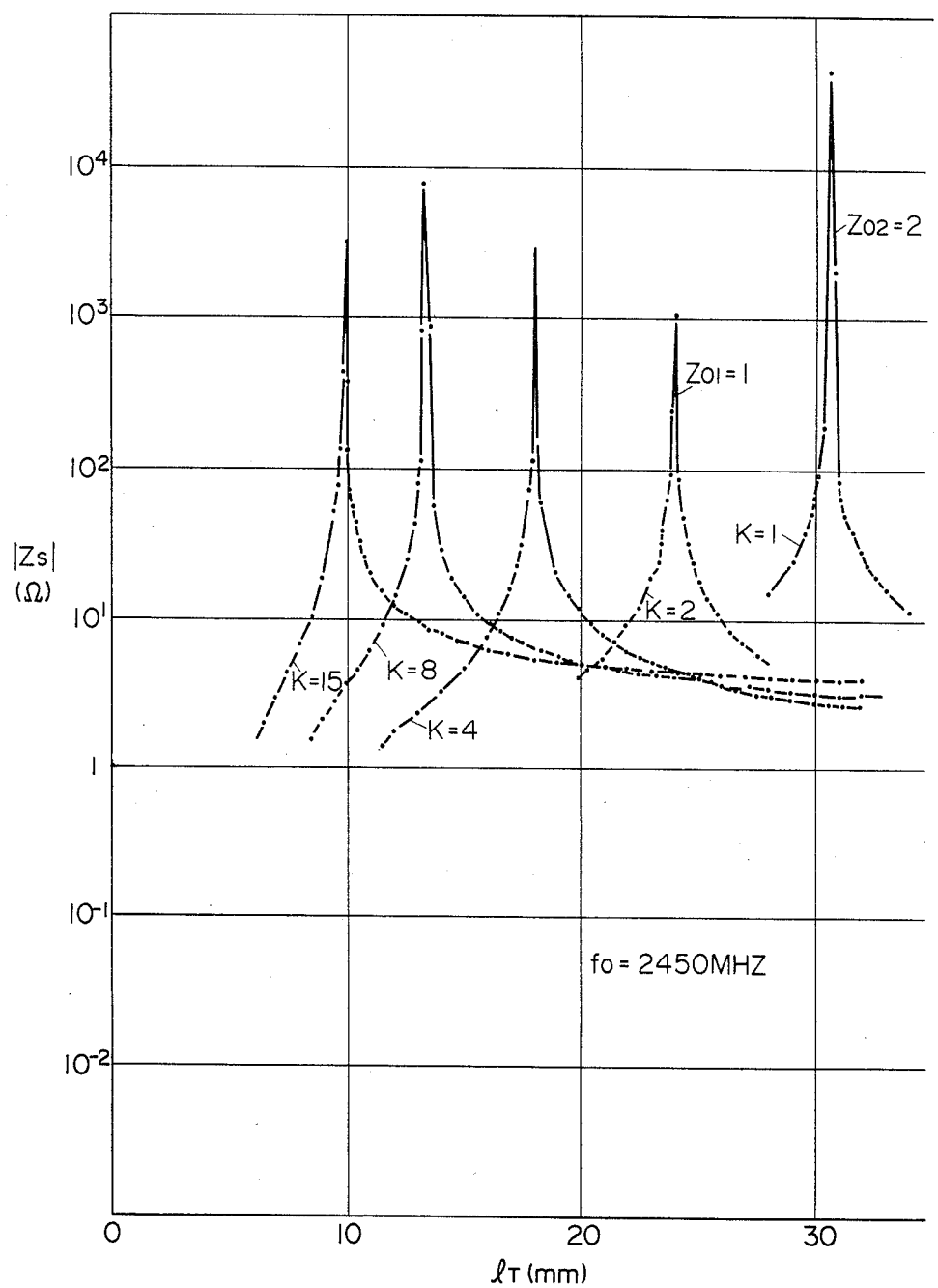

FIG. 7 illustrates an example of the relation between the transmission path length $l_T$ and the absolute value of the starting end impedance, $|Z_S|$, using the characteristic impedance ratio ($K=Z_{02}/Z_{01}$) as a parameter where the transmission receiving end $Z_R$ for the frequency $f_0 = 2450$ kHz is zero. As compared with $l_T \approx 30$ mm for $K=1$ corresponding to the choke type, if the impedance ratio K is 4 it is seen that the length $l_T$ can be reduced to 18 mm.

Figure 8:
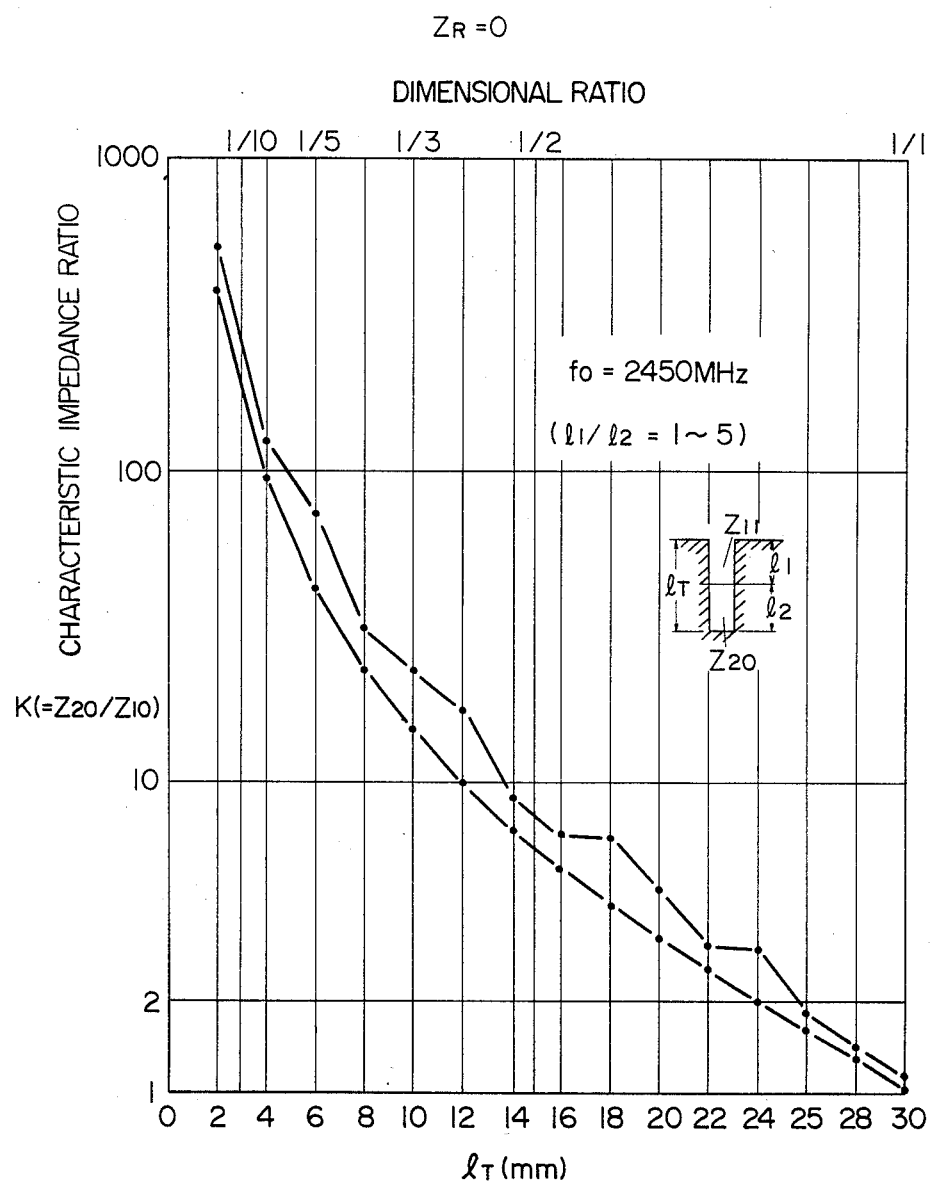

FIG. 8 shows the relation between the dimension $l_T$ which makes the receiving end impedance zero ($Z_R=0$) and the starting end impedance infinite ($Z_S=\infty$) and the impedance ratio K. From the figure, it is seen, for example that if the impedance K is 2, the aforesaid impedance conversion can be attained when $l_T \approx 24$ mm.

FIGS. 9a, b, and c show an example in which the calculated and measured values for electric wave sealing performance are compared in a construction wherein the line width $a = 10$ mm, the patch is 15 mm and the line clearances (corresponding to FIG. 6b) are 3 mm and 6 mm. The impedance $|Z_S|$ was calculated in the case of the impedance ratio $K=2$ since $$Z_{02} = \frac{K \times 6}{a\sqrt{1}} \text{ and } Z_{01} = \frac{K \times 3}{a\sqrt{1}}.$$

The amount $P_L$ of leakage of electric waves was measured by putting 1 l of water in the heating chamber and setting the clearance between the main body and the door to 1 mm.

The calculated and measured values both indicate that the sealing effect is high when the groove depth $l_T \approx 24$ mm, which means that the new, impedance conversion principle and the definition of characteristic impedance are correct.

FIGS. 10a, b, and c show, in terms of numerical analysis, how electric waves propagate from $A_1$ to $B_1$ when a groove with a discontinuous impedance is provided between transmission paths ($A_1-B_1$) and when the depth L of said groove is changed. The curves in the figure are electric fields. The figure shows that the propagation of electric waves can be minimized when the groove depth L is 80% of $\lambda/4$ (it is about 24 mm in the case of 2450 kHz). This corresponds to the case where the characteristic impedance ratio K is 2 in FIG. 8.

From the above description, it can be understood how the concept of the electromagnetic wave energy seal arrangement of the invention is effective for reduction in size. Further, it can be understood that the principle of impedance inversion is based not on the conventional $\lambda/4$ line but on the idea of making the characteristic impedance discontinuous within a line which is shorter than $\lambda/4$, and that theoretically even an electric wave sealing device much smaller than $\lambda/4$ can be attained.

In actual design, experiments centered on calculations are used in finding an optimum value.

Figure 11:
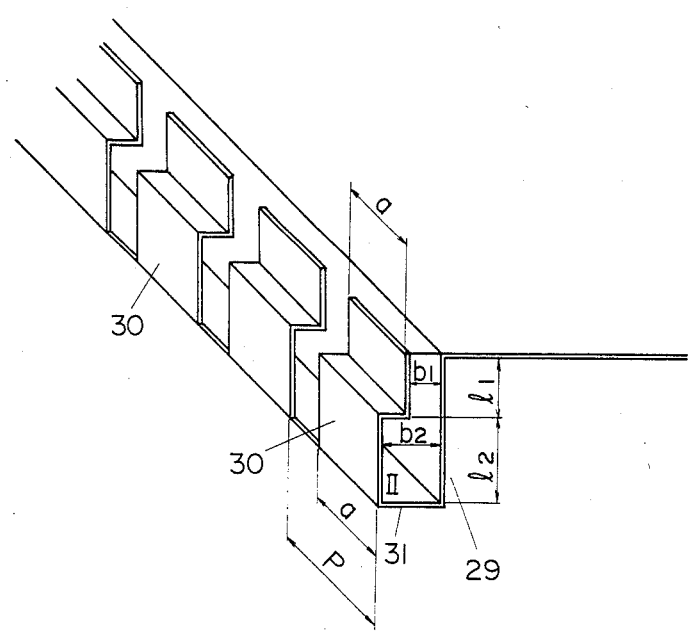
FIG. 11 is a perspective view of said device.

An arrangement for reducing the groove depth will now be described mainly with reference to FIGS. 11~22. In FIG. 11, strip units 30 whose width is approximately a are arranged with a pitch P in opposed relation to a groove wall 29 corresponding to the grounded conductor. Further, the line clearance is smaller at the inlet of the groove. Therefore, the ratio K of the characteristic impedances of the lines is $b_2/b_1$ ($b_2 > b_1$), and the dimension $l_1 + l_2$ from the groove bottom 31 to the groove opening can be made less than $\lambda/4$, the line clearance $b_1$ and $b_2$ being shorter than $\frac{1}{4}$ of the wave length.

Figure 12A:
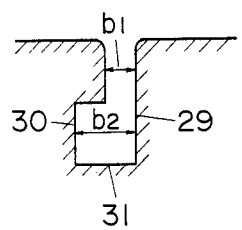
FIGS. 12a, b, and c are sectional views of different embodiments.
Figure 12B:
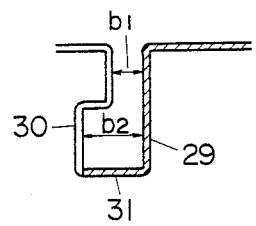
Figure 12C:
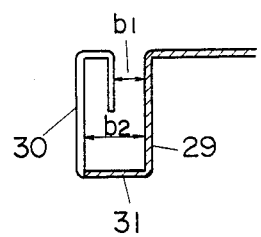
Figure 13:
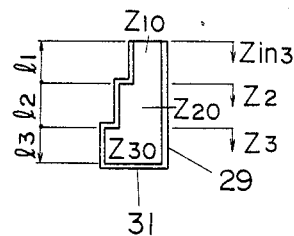
FIG. 13 is a side view of another embodiment of said device.

FIGS. 12a, b, and c show different examples of arrangements for changing the line clearance of the groove. FIG. 13 shows an example in which the line clearance of the groove is changed three times.

Figure 14:
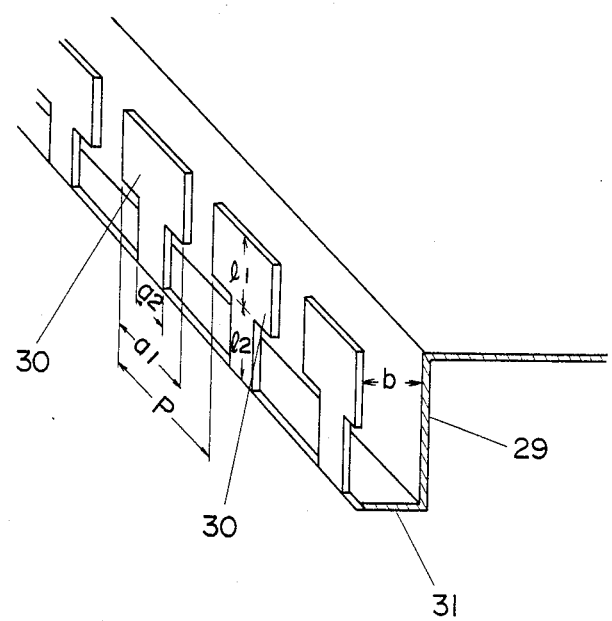
FIGS. 14 and 15 are perspective views of other embodiments of said device.

FIG. 14 shows an example in which the line width is changed. In this case, the characteristic impedance ratio K is $a_1/a_2$ ($a_1 > a_2$).

Figure 15:
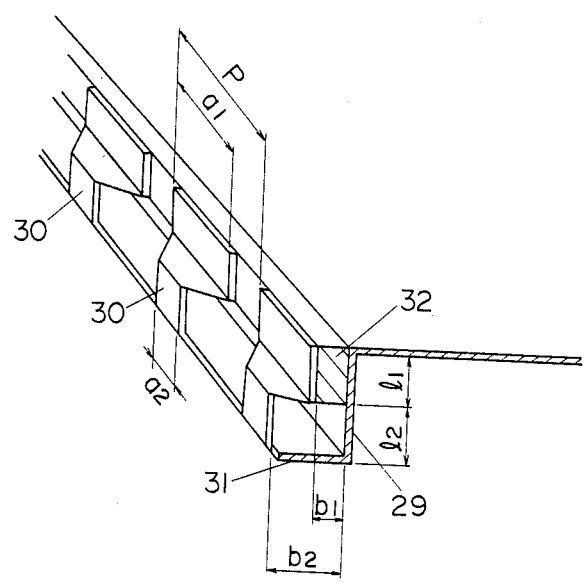

FIG. 15 shows an example in which the line width, line clearance, and specific dielectric constant are all changed. When the specific dielectric constant of a dielectric 32 is $\epsilon_r$, the characteristic impedance ratio K is $$\frac{a_1 \times b_2 \times \sqrt{\epsilon_r}}{a_2 \times b_1}.$$

These factors may be optionally combined according to the purpose of design.

Figure 16:
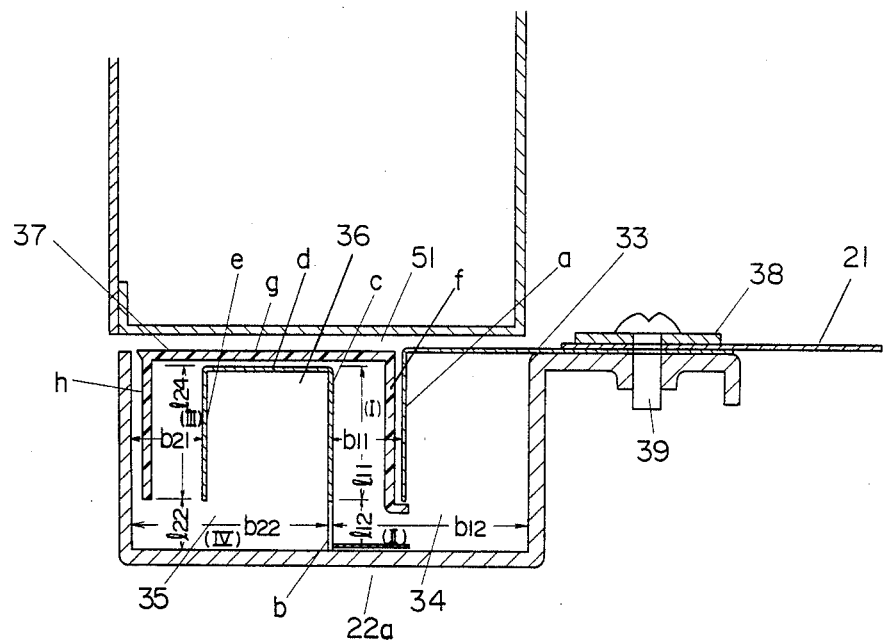
FIG. 16 is a sectional view taken along the line A—A of FIG. 4.
Figure 17:
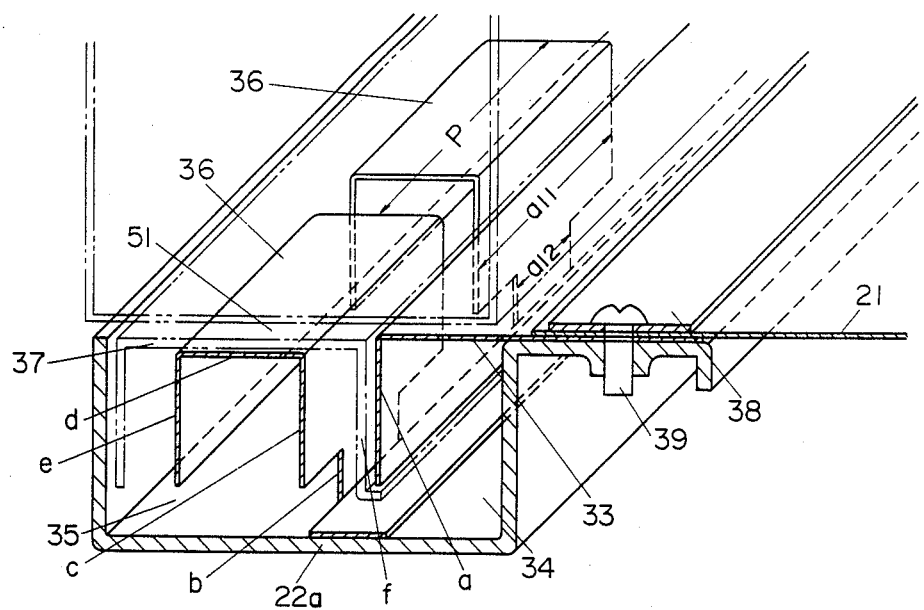
FIG. 17 is a perspective view of FIG. 16.

FIG. 16 is a sectional view taken along the line A—A in FIG. 4, showing an example of an embodiment of the invention. FIG. 17 is a perspective view thereof.

In FIGS. 16 and 17, a sealing plate 33 having a a forms one side of the outer part I of a first groove 34 in laterally open door, and conductor plates 36 forming the sides of the first and second grooves 34 and 35 consist of portions b, c, d, and e bent a U-shape as a whole. A groove cover 37 which covers outer parts I and III of the first and second grooves 34 and 35 also consists of portions f, g, and h similar in shape thereto. The outer parts of the first and second grooves 34 and 35 are denoted by I and III, and the inner parts of the grooves are denoted by II and IV.

A punched plate 21 and the door member 22a are clamped together by means of a clasp 38 and set screws 39.

Conductor plates 36 are spaced at a pitch P and each consists of portions c, d, and e of width $a_{11}$ and a portion b of width $a_{12}$. The clearances of the outer and inner groove parts I and II of groove 34 between the bent portion a of the plate 33 and the portion c and between the portion b and the door member 22a are denoted by $b_{11}$ and $b_{12}$, respectively, and the clearances of the outer and inner groove parts III and IV of groove 35 between the portions e and b of the plate 36 and the door member 22a are denoted by $b_{21}$ and $b_{22}$, respectively. Therefore, the characteristic impedance ratio $K_1$ in the first groove is given by $$K_1 = \frac{a_{11} \cdot b_{12} \cdot \sqrt{\epsilon_{\mathit{eff}1}}}{a_{12} \cdot b_{11}}.$$

The value $K_2$ for the second groove is given by $$K_2 = \frac{a_{11} \cdot b_{22} \cdot \sqrt{\epsilon_{\mathit{eff}2}}}{a_{12} \cdot b_{21}}.$$

The groove depths ($l_{11} + l_{12}$) and ($l_{21} + l_{22}$) are made less than $\frac{1}{4}$ of the wavelength by making $K_1$ and $K_2$ greater than 1.

FIG. 18 shows measurements of operation conditions in FIGS. 16 and 17. Measurements were made at 915 MHz with the gap between the main body and the door member being 2 mm. The dimensions $l_{11}$ and $l_{12}$ were both 15 mm; $b_{11}$ and $b_{12}$ were both 5 mm; $b_{12}$ and $b_{22}$ were both 5 mm; the widths $a_{11}$ and $a_{12}$ were 40 mm and 5 mm, respectively; the pitch P was 50 mm; the dimension of the conductor d was about 10 mm; and the dielectric cover was 2 mm thick and made of ABS resin. The vertical axis of the graph represents measured values of leakage and is graduated in logarithms, while the horizontal axis represents the depths of the first and second grooves 34 and 35 in terms of their proportions to the wavelength used.

As is clear from this characteristic diagram, the groove depth can be reduced to $\frac{1}{4}$ of the conventional $\lambda/4$. The point of the construction is that the dimensions of the conductor portions c and e and of the sealing plate bend (portion a) are approximately equal.

Figure 19A:
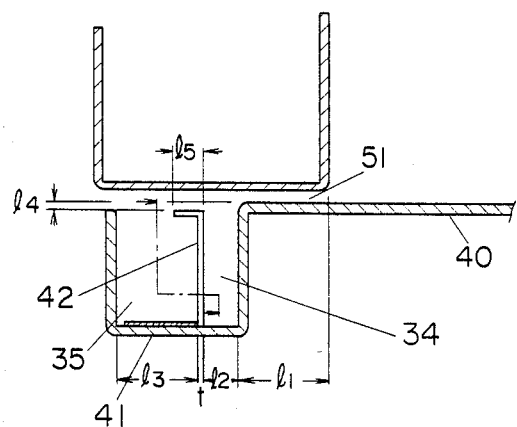
FIGS. 19a and b are a sectional view and a front view, respectively, of another embodiment of said device.
Figure 19B:
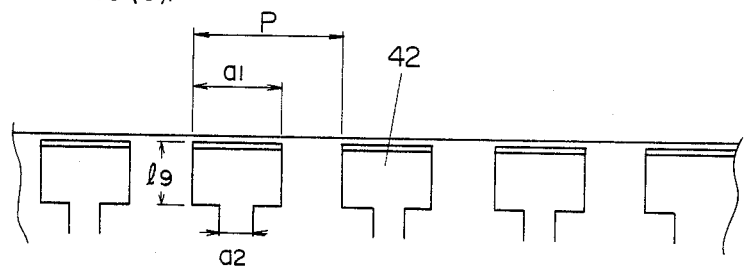
Figure 20A:
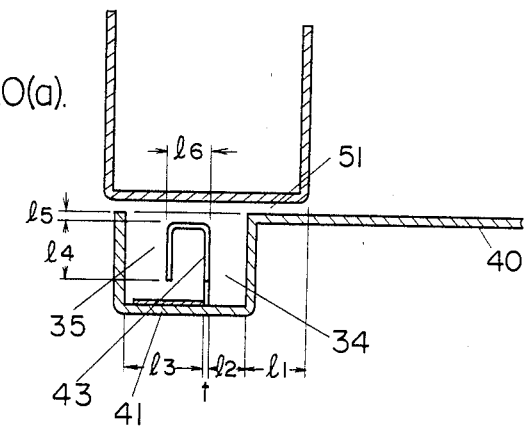
FIGS. 20a and b are a sectional view and a perspective view, respectively, of another embodiment of said device.
Figure 20B:
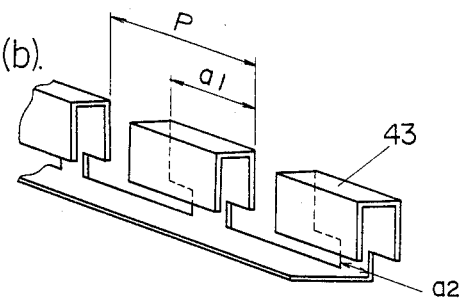
Figure 21A:
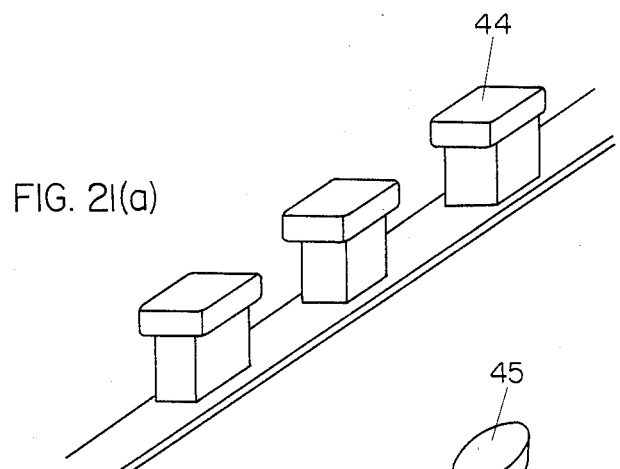
FIGS. 21a, b, and c are perspective views and a sectional view of other embodiments of said device.
Figure 21B:
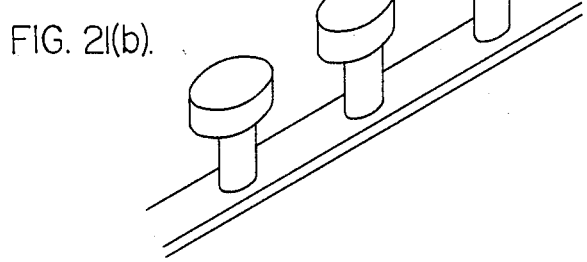
Figure 21C:
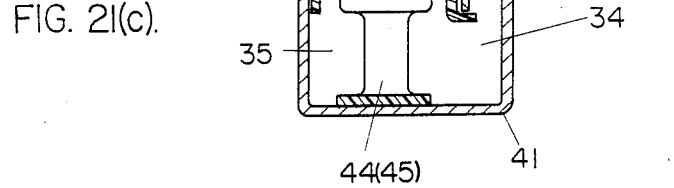

FIGS. 19a and b and FIG. 20 show embodiments wherein the front end of the strip conductor is bent at a right angle and bent double with an inwardly open U-shape, respectively. A laterally open door member 41 having a flat plate 40 contacting a leakage path 60 is provided with respective conductor plates 42 and 43 such bends, respectively. FIGS. 21a, b, and c show examples in which dielectric parts 44 or 45 having a high dielectric constant and longer outer parts and smaller inner parts are installed in a choke of door member 41, as shown in FIG. 21c.

Figure 22A:
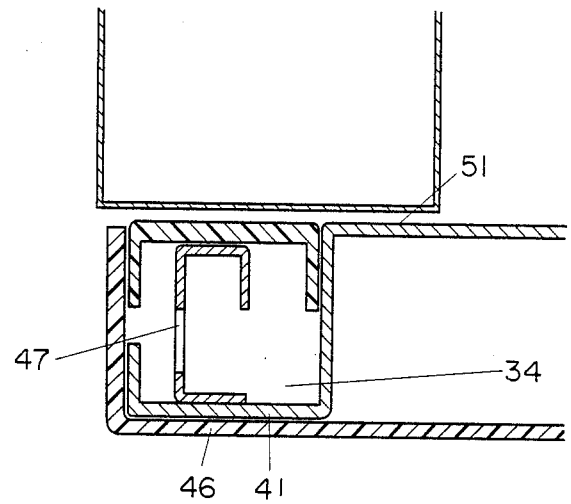
FIGS. 22a and b are a sectional view and a perspective view of said device.
Figure 22B:
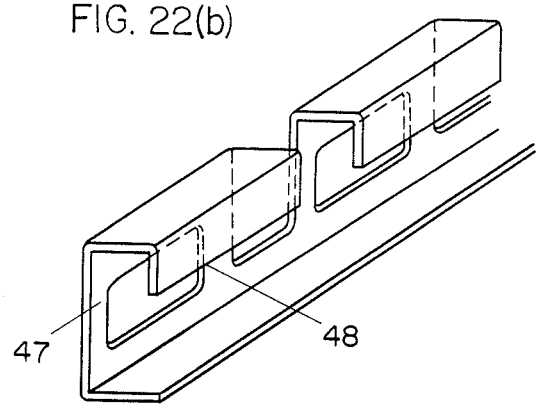

FIGS. 22a and b show another embodiment. This embodiment is characterized by the absence of a sealing plate and the presence of two conductors 47 and 48 constituting the portion corresponding to the dimension $a_2$ of the line width. The door 41 is covered with a plastic cover 46.

Figure 23A:
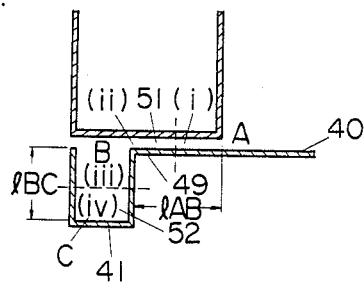
FIGS. 23a and b are a sectional view and a perspective view of another embodiment.
Figure 23B:
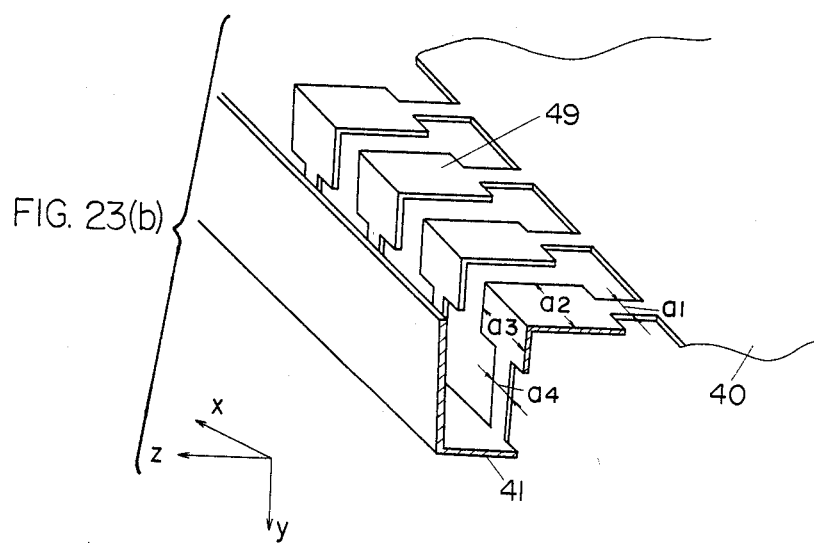
Figure 24:
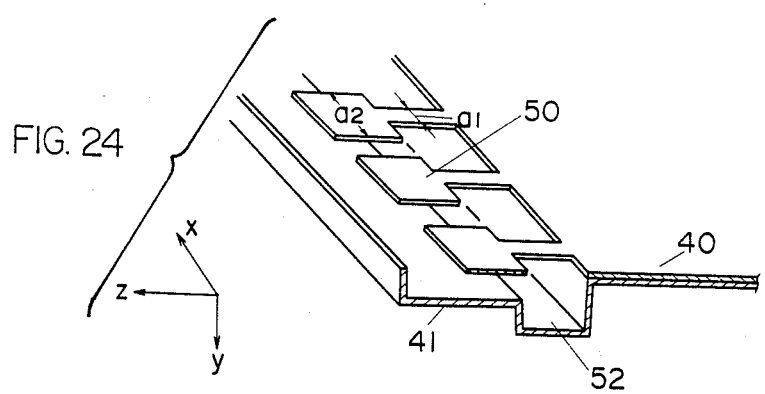
FIG. 24 is a perspective view of another embodiment.
Figure 25A:
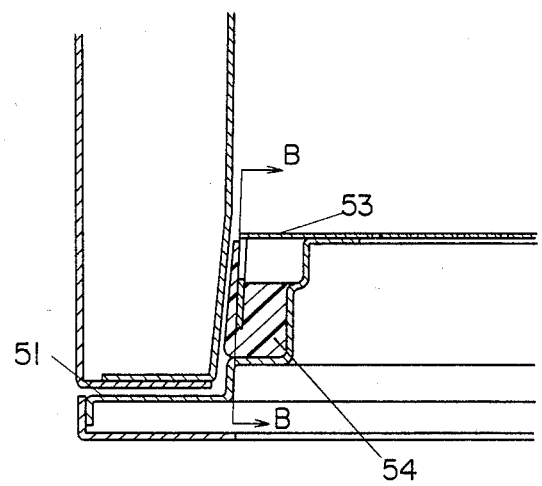
FIGS. 25a and b are a sectional view and a sectional view taken along the line B—B, illustrating another embodiment.
Figure 25B:
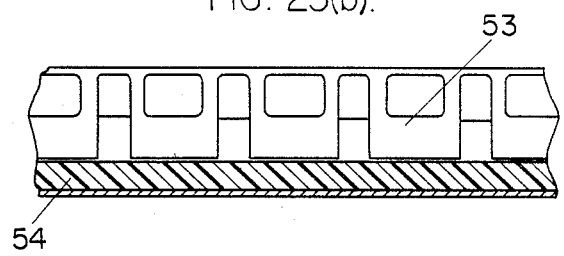

FIGS. 23~25 shows examples of arrangements for reducing not only the groove depth but also the distance from the heating chamber A to the groove opening. In FIG. 23a, by making the characteristic impedances of the regions (i) and (iv) greater than those of the regions (ii) and (iii), the dimensions between A and B and between B and C can be made less than $\lambda/4$ to achieve impedance conversion, concrete examples thereof being shown in FIGS. 23b, 24, and 25a and b. Thus, the width of the strip conductors 49, 50, and 53 is changed along the leakage path and in groove 52. The groove 52 is partly filled with a dielectric filler 54 in the embodiment of FIGS. 25a and b.

Figure 26:
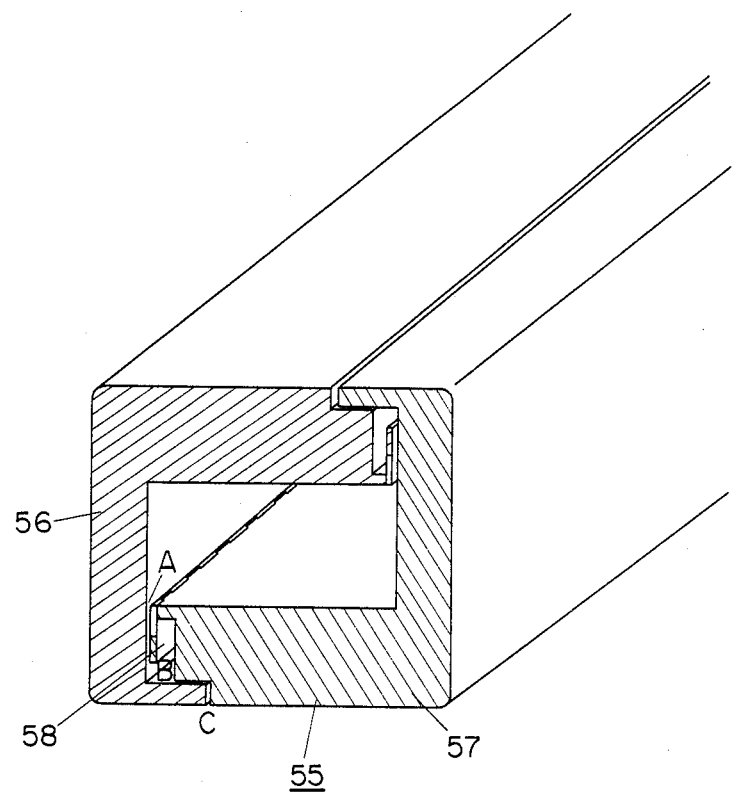
FIG. 26 is a perspective view of another embodiment.
Figure 27A:
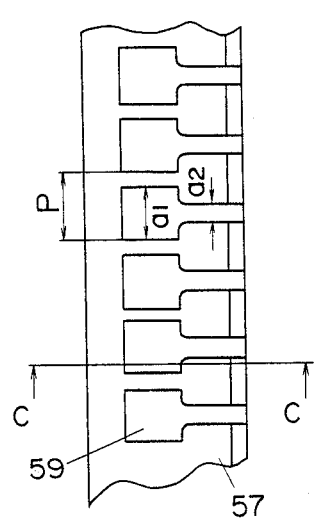
FIGS. 27a, b, and c are plan and front views of another embodiment.
Figure 27B:
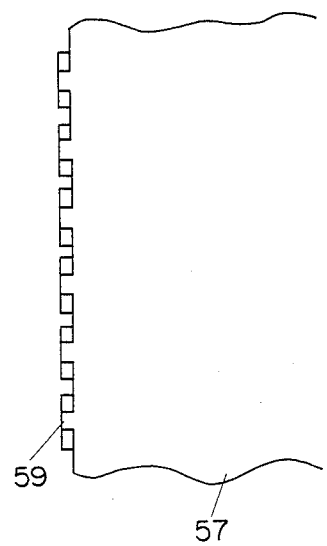
Figure 27C:
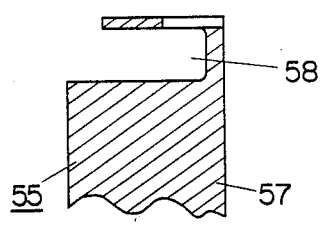

FIGS. 26 and 27 show an embodiment applied to a waveguide 55. The waveguide path (electric wave active space) comprises members 56 and 57, and the waveguide path shown by A-B-C in the figure is provided with an electric wave sealing device. As shown in FIGS. 27a, b, and c, the members 56 and 57 are formed with a groove 58 and strip conductors 59 by machining.

In applying this invention to products, it is not rare to provide a space $T_0 P_1$ for the groove cover and a bent reinforcing portion ($l_{x1}$). These tend to cause the sealing device to deviate more or less from the following calculated dimension because of disturbance of electric waves, in contrast to the situation in which the principle was explained.

$$1 = K \tan \beta_1 l_2 \cdot \tan \beta_2 l_2$$

The effects of the deviation are given below.

Some examples will be given, one in which the dimension of $T_{0P1}$ is 2 mm, and the other in which $l_{x1}$ is 5~6 mm.

Figures 28A, 28B:
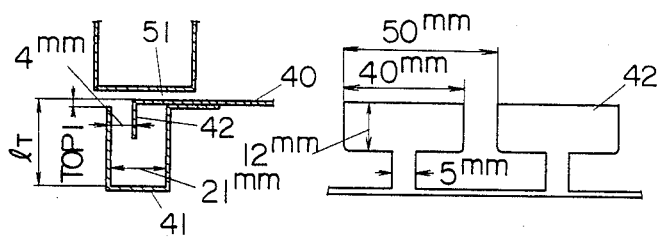
FIGS. 28a and b are a sectional view and a front view of another embodiment.
Figure 29:
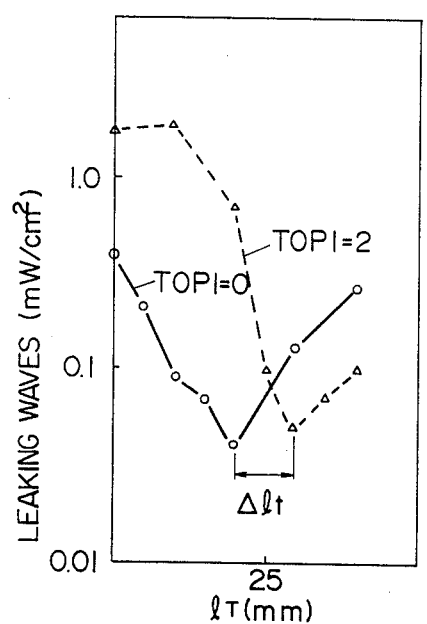
FIG. 29 is a characteristic diagram of FIG. 28.
Figure 30A:
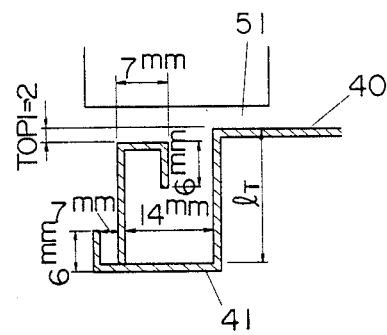
FIGS. 30a and b are a sectional view and a front view of another embodiment.
Figure 30B:
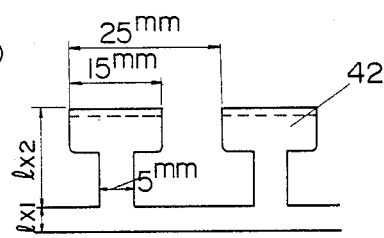
Figure 31:
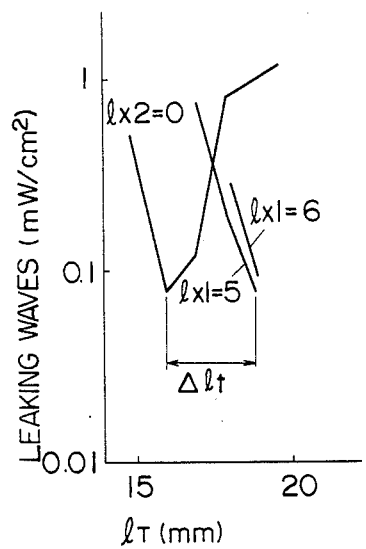
FIG. 31 is a characteristic diagram of FIG. 30.

FIGS. 28a and b show an example of a sealing device for 915 MHz, illustrating the relation in which the groove depth $l_T$ changes by the dimension of $T_{0P1}$. When the dimension of $T_{0P1}$ is 1~3 mm, $l_T$ becomes 1~6 mm deeper. FIG. 29 is a characteristic diagram therefor. FIGS. 30a and b show an example of a sealing device for 2450 MHz, illustrating the relation in which the groove depth $l_T$ changes with the reinforcing space ($l_{x1}$) when $T_{0P1}=2$ mm. When the space $l_{x1}$ is 2~6 mm, the groove depth $l_T$ becomes 1~3 mm greater.

As is clear from the embodiments and measured values, in addition to the effect of being capable of realizing reduction in size, which is an object of the invention, the following effects are obtained.

(1) Since the size of the bent portion of the sealing plate is reduced, the groove of the door can be formed without undercut.

(2) The bent portion serves to hold the dielectric cover.

(3) By equalizing the characteristic impedance ratios of the first groove and the other grooves, the sealing performance can be improved, as compared with the case of a single groove.

(4) By changing the characteristic impedance ratios of the first groove and the other grooves, it is possible to obtain a high frequency heating apparatus having two oscillation sources, e.g. one being for 2450 MHz and the other for 915 MHz, by suitably setting the impedance conversion frequency.

The above embodiments are basic ones mainly using straight lines, but it goes without saying that the present invention can be embodied in many modifications using oblique lines and curves. Further, the constituent material is not limited to metal plates, and composite conductive materials and plastics plated with a conductive material may be contemplated. The present invention has many applications; for example, the present electric wave sealing device may be used in combination with another sealing device, such as an electric wave absorbing body.

Further, the strip conductors may be placed at any location on the groove walls.

INDUSTRIAL APPLICABILITY

As has been described so far, according to the present invention, it is possible to provide an electromagnetic wave energy seal arrangement smaller than $\lambda/4$ of the frequency to be used for preventing leakage of high frequency electromagnetic waves in equipment producing high frequency electromagnetic waves, such as microwave ovens and wireless systems using waveguides. The invention enables the electromagnetic wave energy seal arrangement to be reduced in size.

What is claimed is:

1. An electromagnetic wave energy seal arrangement comprising:

at least a pair of members separably fitted together and defining at least one electromagnetic active space for confining electromagnetic waves from a high frequency oscillation source, said pair of members having opposed portions defining a leakage path for electromagnetic waves from said space to the exterior around said space, at least one of said members having at least one groove in the portion defining said leakage path with the depth thereof for attenuating the electromagnetic waves of basic frequency extending perpendicular to the direction of said leakage path, and the groove extending along said one member transverse to the direction of the leakage path; and a plurality of conductor plates extending along the groove on at least one surface of the portion of said one member defining said leakage path and groove, said conductor plates extending from the bottom of said one groove remote from the other member toward said other member, the width of the groove being less than ¼ the effective wavelength of the electromagnetic waves of basic frequency, at least one parameter from among the width of said conductor plates, the clearance between said conductor plates and the surface of the groove opposed to said conductor plates, and the dielectric constant of any dielectric in said groove, is different at the outer portion of the groove adjacent the leakage path than at the inner portion, and wherein the depth of said groove is less than ¼ of the effective wavelength of the electromagnetic waves in said leakage path and the sum of the depth of said groove and the width thereof is also less than ¼ the effective wavelength of the electromagnetic waves in said leakage path.

2. An electromagnetic wave energy seal arrangement as claimed in claim 1 wherein the conductor plate width, the clearance, and the specific dielectric constant are such that the relationship $b/a\sqrt{\epsilon_r}$, wherein a is the conductor plate width, b is the clearance, and $\epsilon_r$ is the dielectric constant, has at least two values in the different portions of the groove.

3. An electromagnetic wave energy seal arrangement as claimed in claim 1 in which at least one parameter from among the width of said conductor plates, the clearance between said conductor plates and the surface of the groove opposed to said conductor plates, and the dielectric constant of any dielectric in said groove, is different at the outer portion of the groove adjacent the leakage path than at the inner portion, and the depth of the groove is less than ¼ of the effective wavelength of the electromagnetic waves in said leakage path.

4. An electromagnetic wave energy seal arrangement as claimed in claim 3 in which there are a plurality of said grooves with conductor plates.

5. An electromagnetic wave energy seal arrangement as claimed in claim 4 in which there are a plurality of electromagnetic active spaces each confining electromagnetic waves of different frequencies, and the resonance frequencies of the respective grooves and conductor plates are substantially equal to the frequencies of the electromagnetic waves in the respective spaces.

6. An electromagnetic wave energy seal arrangement as claimed in claim 4 in which there are a plurality of electromagnetic active spaces each confining electromagnetic waves of different frequencies, and the resonance frequencies of the respective grooves and conductor plates corresponding to the frequencies of the electromagnetic waves in the respective spaces.

7. A heating apparatus comprising:

an enclosure having at least one wall member with an access opening therein;

means for energizing said enclosure with microwaves having at least one predetermined frequency;

a door member on said enclosure for closing said access opening and when in the closed position defining with the edge of said wall member around said access opening a leakage path for electromagnetic waves from said enclosure to the exterior around said enclosure, at least one of said members having at least one groove in the portion defining said leakage path with the depth thereof for attenuating the electromagnetic waves of basic frequency extending perpendicular to the direction of said leakage path, and the groove extending along said one member transverse to the direction of the leakage path; and a plurality of conductor plates extending along the groove on at least one surface of the portion of said one member defining said leakage path and groove, said conductor plates extending from the bottom of said one groove remote from the other member toward said other member, the width of the groove being less than ¼ the effective wavelength of the electromagnetic waves of basic frequency, at least one parameter from among the width of said conductor plates, the clearance between said conductor plates and the surface of the groove opposed to said conductor plates and the dielectric constant of any dielectric in said groove, is different at the outer portion of the groove adjacent the leakage path than at the inner portion, and wherein the depth of said groove is less than ¼ of the effective wavelength of the electromagnetic waves in said leakage path and the sum of the depth of said groove and the width thereof is also less than ¼ the effective wavelength of the electromagnetic waves in said leakage path.

8. An electromagnetic wave and energy seal arrangement as claimed in claim 7 further comprising a dielectric cover covering said groove where it opens into said leakage path, 9. An electromagnetic wave energy seal arrangement comprising:

a heating chamber having an access opening thereto and having a flat plate around said access opening;

a high frequency oscillation means supplying electromagnetic waves to said heating chamber;

a door mounted on said chamber for opening and closing said access opening, said door when in the closed position defining a leakage path between it and said flat plate;

said door having a plurality of grooves therein opening into said leakage path and extending along said door opposite said flat plate with the depth extending perpendicular to the direction of the leakage path, the width of each groove being less than ¼ the effective wavelength of the electromagnetic waves of basic frequency; and a plurality of dielectric parts having a high dielectric constant mounted along said grooves for serving as waveguide bodies, said dielectric parts having a shape which changes in the direction of the depth of said grooves the depth of each groove being less than ¼ of the effective wavelength of the electromagnetic waves in said leakage path and the sum of the depth of each groove and the width thereof is also less than ¼ the effective wavelength of the electromagnetic waves in said leakage path.

* * * * *